(12) United States Patent
Inoue et al.

(10) Patent No.: US 10,848,121 B2
(45) Date of Patent: Nov. 24, 2020

(54) GUIDED SAW DEVICE

(71) Applicant: Qorvo US, Inc., Greensboro, NC (US)

(72) Inventors: Shogo Inoue, Longwood, FL (US); Marc Solal, Longwood, FL (US)

(73) Assignee: Qorvo US, Inc., Greensboro, NC (US)

( * ) Notice: Subject to any disclaimer, the term of this patent is extended or adjusted under 35 U.S.C. 154(b) by 522 days.

(21) Appl. No.: 15/784,592

(22) Filed: Oct. 16, 2017

(65) Prior Publication Data

US 2018/0159495 A1 Jun. 7, 2018

Related U.S. Application Data

(60) Provisional application No. 62/408,405, filed on Oct. 14, 2016.

(51) Int. Cl.
| | |
|---|---|
| *H03H 9/25* | (2006.01) |
| *H03H 9/145* | (2006.01) |
| *H03H 9/02* | (2006.01) |
| *H03H 9/64* | (2006.01) |

(52) U.S. Cl.
CPC .... *H03H 9/02566* (2013.01); *H03H 9/02559* (2013.01); *H03H 9/02574* (2013.01); *H03H 9/14564* (2013.01); *H03H 9/6433* (2013.01)

(58) Field of Classification Search
CPC .......... H03H 9/02566; H03H 9/02559; H03H 9/02574; H03H 9/14564; H03H 9/6433
USPC ..................... 310/313 A–313 D, 313 R, 360; 333/187–193
See application file for complete search history.

(56) References Cited

U.S. PATENT DOCUMENTS

| | | |
|---|---|---|
| 3,601,639 A | 8/1971 | Hannon et al. |
| 4,016,440 A | 4/1977 | Wagers |
| 6,445,265 B1 | 9/2002 | Wright |
| 9,431,996 B2 | 8/2016 | Watanabe et al. |
| 2005/0146243 A1 | 7/2005 | Cherednick et al. |
| 2007/0216261 A1 | 9/2007 | Higuchi et al. |
| 2012/0194032 A1* | 8/2012 | Kadota ............ H03H 9/02574 310/313 A |
| 2013/0285768 A1 | 10/2013 | Watanabe et al. |
| 2017/0033756 A1 | 2/2017 | Inoue et al. |
| 2017/0033764 A1 | 2/2017 | Inoue et al. |
| 2017/0222618 A1 | 8/2017 | Inoue et al. |
| 2017/0222622 A1 | 8/2017 | Solal et al. |

(Continued)

OTHER PUBLICATIONS

Author Unknown, "An American National Standard: IEEE Standard on Piezoelectricity," ANSI/IEEE Std 176-1987, Sponsored by the Standards Committee of the IEEE Ultrasonics, Ferroelectrics, and Frequency Control Society, The Institute of Electrical and Electronics Engineers, Inc., Copyright 1988, 74 pages.

(Continued)

*Primary Examiner* — Thomas M Dougherty
(74) *Attorney, Agent, or Firm* — Withrow & Terranova P.L.L.C.

(57) ABSTRACT

A guided surface acoustic wave (SAW) device includes a substrate, a piezoelectric layer on the substrate, and a transducer on the piezoelectric layer. The substrate is silicon, and has a crystalline orientation defined by a first Euler angle ($\phi$), a second Euler angle ($\theta$), and a third Euler angle ($\psi$). The first Euler angle ($\phi$), the second Euler angle ($\theta$), and the third Euler angle ($\psi$) are chosen such that a velocity of wave propagation within the substrate is less than 5,400 m/s.

19 Claims, 15 Drawing Sheets

(56) References Cited

U.S. PATENT DOCUMENTS

| | | |
|---|---|---|
| 2018/0006629 A1 | 1/2018 | Tanno et al. |
| 2018/0080144 A1 | 3/2018 | Tanno et al. |
| 2018/0102760 A1 | 4/2018 | Inoue et al. |
| 2018/0109241 A1 | 4/2018 | Inoue et al. |
| 2018/0109242 A1 | 4/2018 | Solal et al. |
| 2018/0152170 A1 | 5/2018 | Iwamoto |

OTHER PUBLICATIONS

Iwamoto, H., et al., "A Novel SAW Resonator with Incredible High-Performances," 2017 IEEE International Meeting for Future of Electron Devices, Jun. 29-30, 2017, Kyoto, Japan, 2 pages.

Pastureaud, T., et al., "High-Frequency Surface Acoustic Waves Excited on Thin-Oriented LiNbO3 Single-Crystal Layers Transferred Onto Silicon," IEEE Transactions on Ultrasonics, Ferroelectrics, and Frequency Control, vol. 54, No. 4, Apr. 2007, pp. 870-876.

Solal, M., et al., "Oriented lithium niobate layers transferred on 4" [100] silicon wafer for RF SAW devices," Proceedings of the 2002 IEEE International Ultrasonics Symposium, Oct. 8-11, 2002, Munich, Germany, pp. 131-134.

Takai, T., et al., "Incredible High Performance SAW resonator on Novel Multi-layerd Substrate," 2016 IEEE International Ultrasonics Symposium, Sep. 18-21, 2016, Tours, France, 4 pages.

Takai, T., et al., "I.H.P. SAW technology and its application to micro acoustic components," 2017 IEEE International Ultrasonics Symposium, Sep. 6-9, 2017, Washington, D.C., USA, 8 pages.

Non-Final Office Action for U.S. Appl. No. 15/785,760, dated May 11, 2020, 10 pages.

* cited by examiner

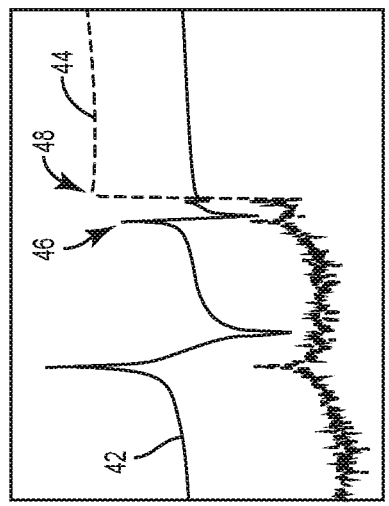
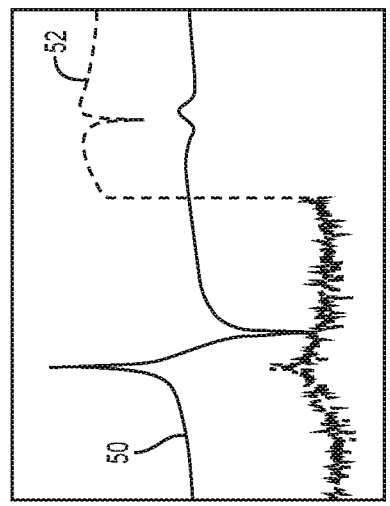
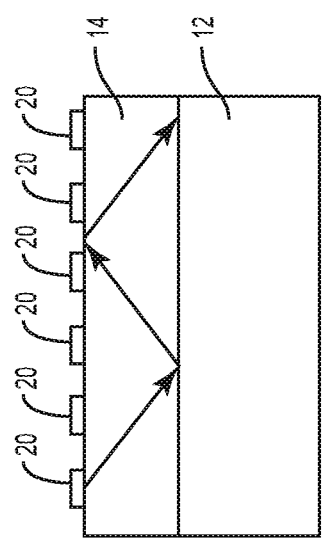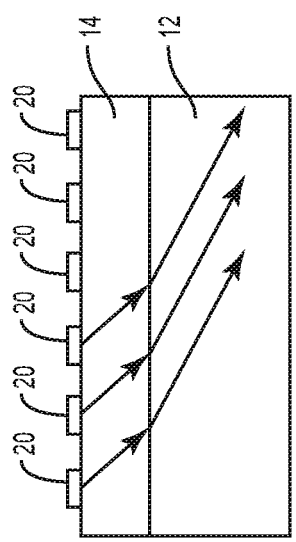
FIG. 4A
FIG. 4B
FIG. 4C
FIG. 4D

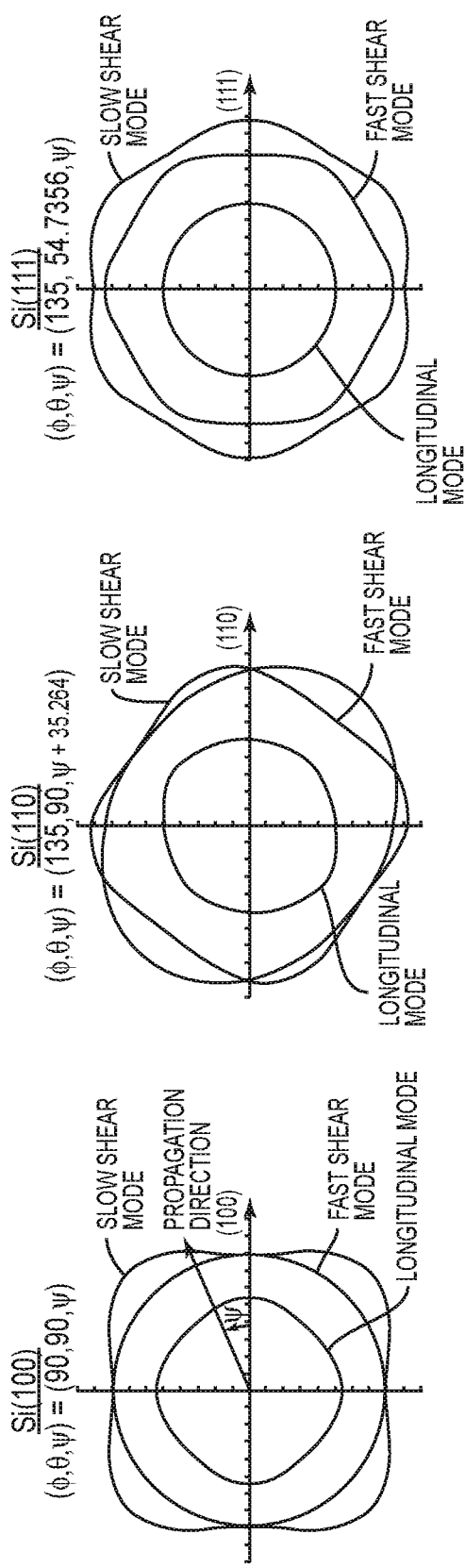
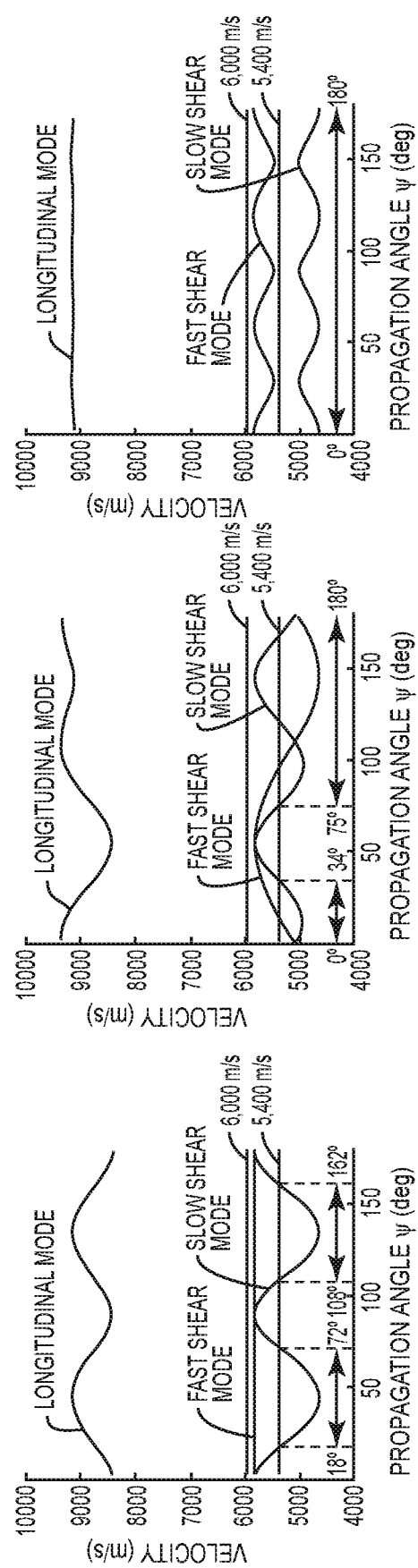
FIG. 7A
FIG. 7B
FIG. 7C

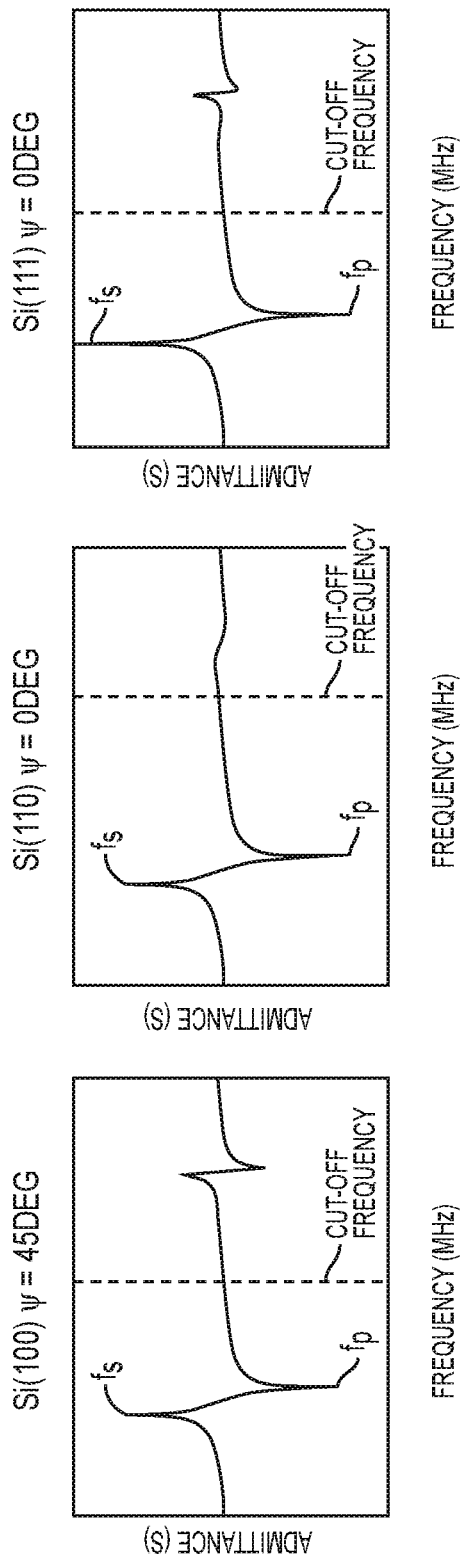

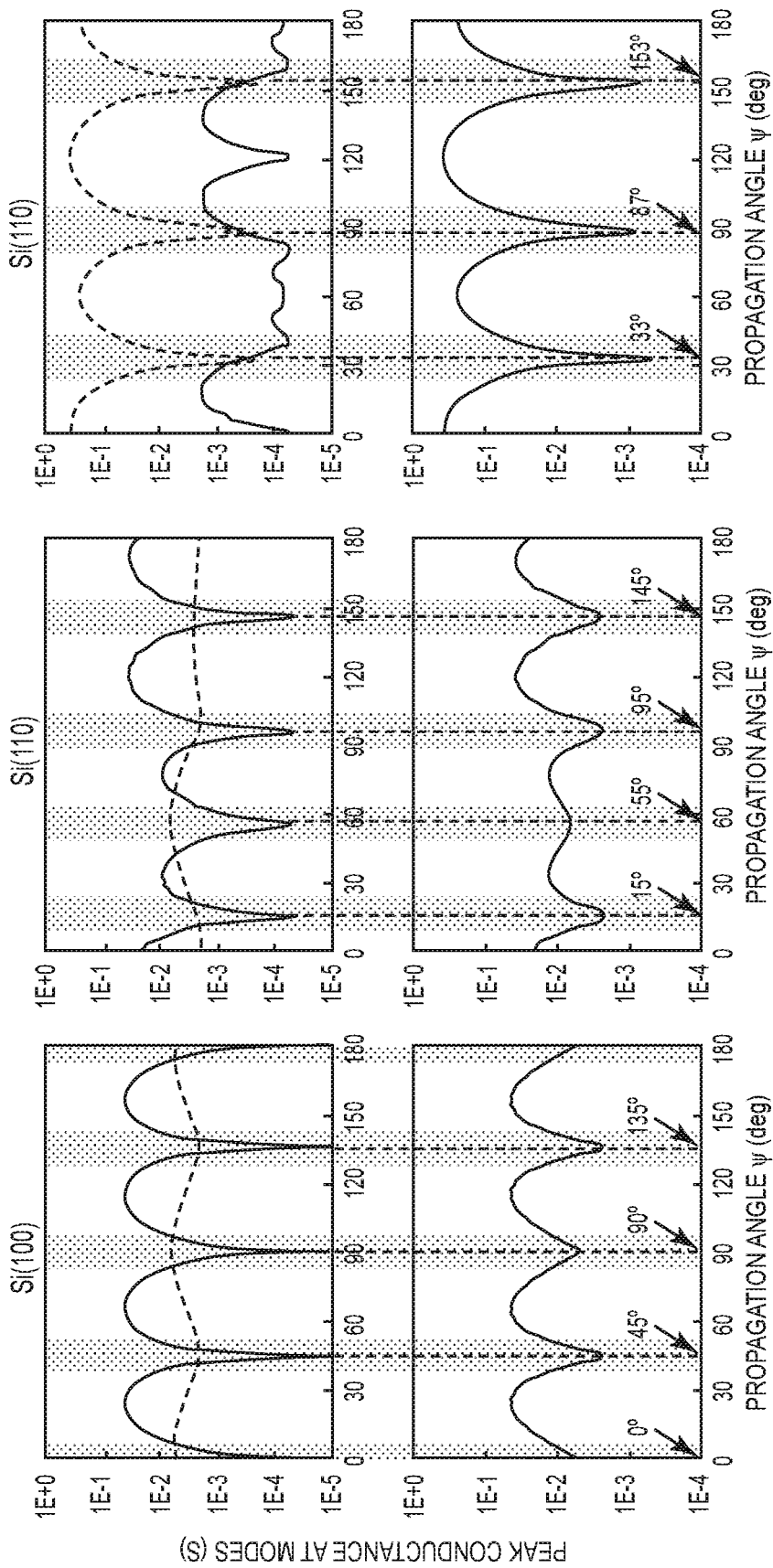

GUIDED SAW DEVICE

RELATED APPLICATIONS

This application claims the benefit of provisional patent application Ser. No. 62/408,405, filed Oct. 14, 2016, the disclosure of which is hereby incorporated herein by reference in its entirety.

FIELD OF THE DISCLOSURE

The present disclosure relates to acoustic wave devices, and in particular to guided acoustic wave devices configured to reduce one or more spurious modes.

BACKGROUND

Acoustic wave devices are widely used in modern electronics. At a high level, acoustic wave devices include a piezoelectric material in contact with one or more electrodes. Piezoelectric materials acquire a charge when compressed, twisted, or distorted, and similarly compress, twist, or distort when a charge is applied to them. Accordingly, when an alternating electrical signal is applied to the one or more electrodes in contact with the piezoelectric material, a corresponding mechanical signal (i.e., an oscillation or vibration) is transduced therein. Based on the characteristics of the one or more electrodes on the piezoelectric material, the properties of the piezoelectric material, and other factors such as the shape of the acoustic wave device and other structures provided on the device, the mechanical signal transduced in the piezoelectric material exhibits a frequency dependence on the alternating electrical signal. Acoustic wave devices leverage this frequency dependence to provide one or more functions.

Exemplary acoustic wave devices include surface acoustic wave (SAW) resonators and bulk acoustic wave (BAW) resonators, which are increasingly used to form filters used in the transmission and reception of RF signals for communication. Due to the stringent demands placed on filters for modern RF communication systems, acoustic wave devices for these applications must provide high quality factor, wide bandwidth (i.e., high electromechanical coupling coefficient), and favorable temperature coefficient of frequency. Often, undesired oscillations or vibrations are transduced in the piezoelectric material of an acoustic wave device, which degrade these characteristics. These undesired oscillations or vibrations are often referred to as spurious modes. There is a need for acoustic wave devices with reduced spurious modes such that the acoustic wave devices provide high quality factor, low loss, favorable temperature coefficient of frequency, and high bandwidth.

SUMMARY

The present disclosure relates to acoustic wave devices, and in particular to guided acoustic wave devices configured to reduce one or more spurious modes. In one embodiment, a guided surface acoustic wave (SAW) device includes a substrate, a piezoelectric layer on the substrate, and a transducer on the piezoelectric layer. The substrate is silicon, and has a crystalline orientation defined by a first Euler angle ($\phi$), a second Euler angle ($\theta$), and a third Euler angle ($\psi$). The first Euler angle ($\phi$), the second Euler angle ($\theta$), and the third Euler angle ($\psi$) are chosen such that a velocity of wave propagation within the substrate is less than 5,400 m/s. By limiting the velocity of wave propagation in the substrate using the crystalline orientation of the substrate, higher order spurious modes may be suppressed, thereby improving the performance of the guided SAW device.

In one embodiment, the first Euler angle ($\phi$), the second Euler angle ($\theta$), and the third Euler angle ($\psi$) are chosen such that a stopband provided by the guided SAW device has a bandwidth greater than 160 MHz and an integral quality of the guided SAW device is greater than 800,000 within the stopband.

In one embodiment, the first Euler angle ($\phi$), the second Euler angle ($\theta$), and the third Euler angle ($\psi$) are chosen such that a peak conductance of lower frequency spurious modes below a series resonance frequency of the guided SAW device is significantly reduced.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 4A-4D illustrate the cross-sectional view of a guided SAW device according to one embodiment of the present disclosure as well as the admittance and conductance of the guided SAW device.

FIGS. 7A-7C illustrate the slowness curves and velocity variation with propagation angle for different cuts of silicon.

FIGS. 8A-8C illustrate the admittance of a guided SAW device according to one embodiment of the present disclosure.

FIGS. 10A-10C illustrate a relationship between peak conductance of one or more spurious modes and the crystalline orientation of a substrate of a guided SAW device according to one embodiment of the present disclosure.

DETAILED DESCRIPTION

Figure 1:
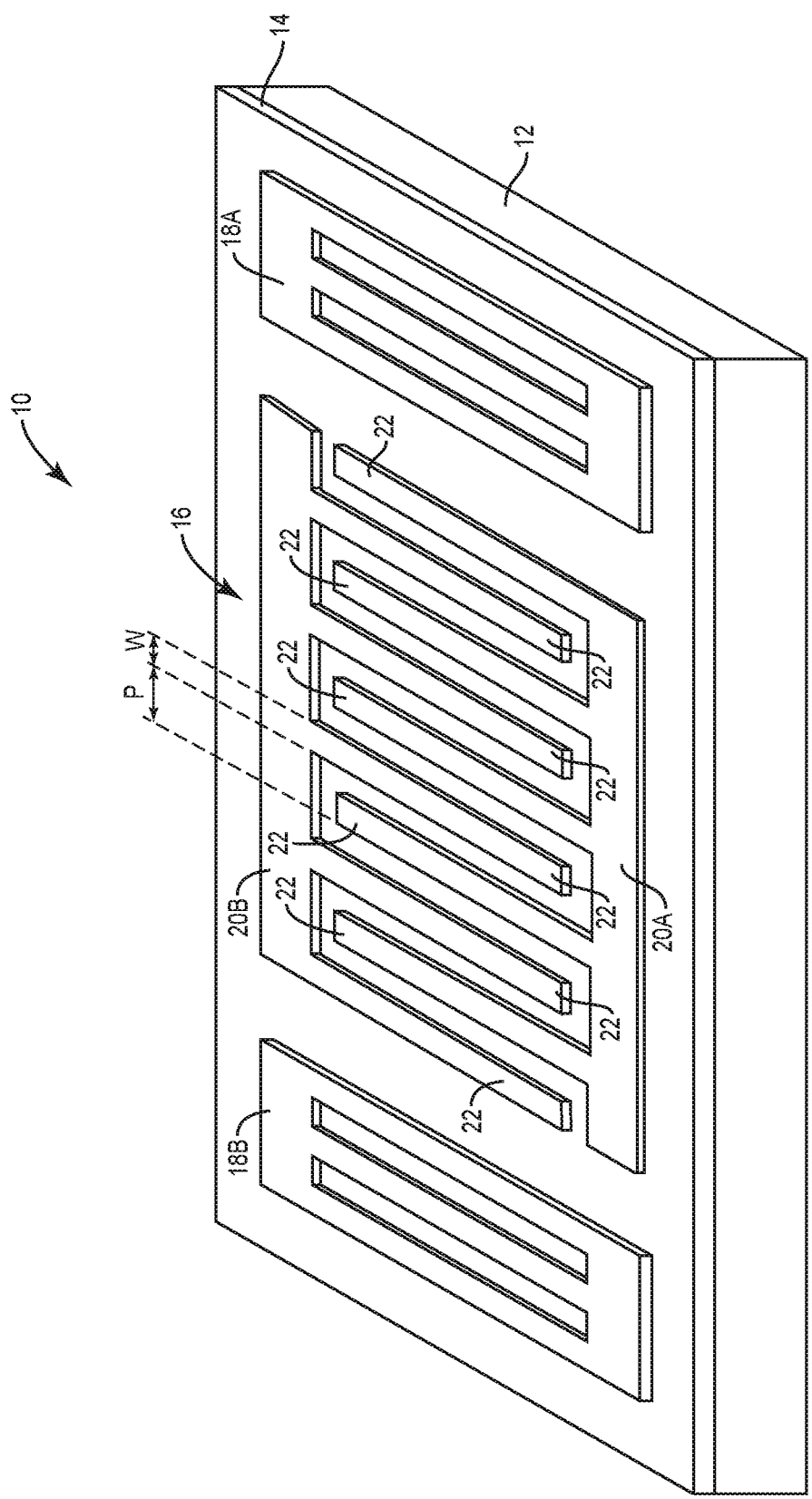
FIG. 1 illustrates a guided surface acoustic wave (SAW) device according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 shows details of a guided SAW device 10 according to one embodiment of the present disclosure. The guided SAW device 10 includes a substrate 12, a piezoelectric layer 14 on the substrate 12, an interdigital transducer 16 on a surface of the piezoelectric layer 14 opposite the substrate 12, a first reflector structure 18A on the surface of the piezoelectric layer 14 adjacent to the interdigital transducer 16, and a second reflector structure 18B on the surface of the piezoelectric layer 14 adjacent to the interdigital transducer 16 opposite the first reflector structure 18A.

The interdigital transducer 16 includes a first comb electrode 20A and a second comb electrode 20B, each of which include a number of electrode fingers 22 that are interleaved with one another as shown. A lateral distance between adjacent electrode fingers 22 of the first comb electrode 20A and the second comb electrode 20B defines an electrode pitch P of the interdigital transducer 16. The electrode pitch P may at least partially define a center frequency wavelength $\lambda$ of the guided SAW device 10, where the center frequency is the primary frequency of mechanical waves generated in the piezoelectric layer 14 by the interdigital transducer 16. For a single electrode interdigital transducer 16 such as the one shown in FIG. 1, the center frequency wavelength $\lambda$ is equal to twice the electrode pitch P. For a double electrode interdigital transducer 16, the center frequency wavelength is equal to four times the electrode pitch P. A finger width W of the adjacent electrode fingers 22 over the electrode pitch P may define a metallization ratio M of the interdigital transducer 16, which may dictate certain operating characteristics of the guided SAW device 10.

In operation, an alternating electrical input signal provided at the first comb electrode 20A is transduced into a mechanical signal in the piezoelectric layer 14, resulting in one or more acoustic waves therein. In the case of the guided SAW device 10, the resulting acoustic waves are predominately surface acoustic waves. As discussed above, due to the electrode pitch P and the metallization ratio M of the interdigital transducer 16, the characteristics of the material of the piezoelectric layer 14, and other factors, the magnitude and frequency of the acoustic waves transduced in the piezoelectric layer 14 are dependent on the frequency of the alternating electrical input signal. This frequency dependence is often described in terms of changes in the impedance and/or a phase shift between the first comb electrode 20A and the second comb electrode 20B with respect to the frequency of the alternating electrical input signal. The alternating electrical potential between the two comb electrodes 20A and 20B creates an electrical field in the piezoelectric material which generate acoustic waves. The acoustic waves travel at the surface and eventually are transducer back into an electrical signal between the comb electrodes 20A and 20B. The first reflector structure 18A and the second reflector structure 18B reflect the acoustic waves in the piezoelectric layer 14 back towards the interdigital transducer 16 to confine the acoustic waves in the area surrounding the interdigital transducer 16.

In one embodiment, the substrate 12 is silicon and the piezoelectric layer 14 is lithium tantalate. Specifically, the substrate 12 may be silicon cut at the (100) miller plane, the (110) miller plane, or the (111) miller plane. As discussed in detail below, the crystalline orientation of the substrate 12 may be translated from one of these reference planes to increase the performance of the guided SAW device 10. The piezoelectric layer may be 42° Y-X lithium tantalate. Those skilled in the art will appreciate that the principles of the present disclosure may apply to other materials for the substrate 12 and the piezoelectric layer 14. The interdigital transducer 16, the first reflector structure 18A, and the second reflector structure 18B may comprise aluminum. While not shown to avoid obscuring the drawings, additional passivation layers, frequency trimming layers, or any other layers may be provided over all or a portion of the exposed surface of the piezoelectric layer 14, the interdigital transducer 16, the first reflector structure 18A, and the second reflector structure 18B. Further, one or more layers may be provided between the substrate 12 and the piezoelectric layer 14 in various embodiments.

Figure 2:
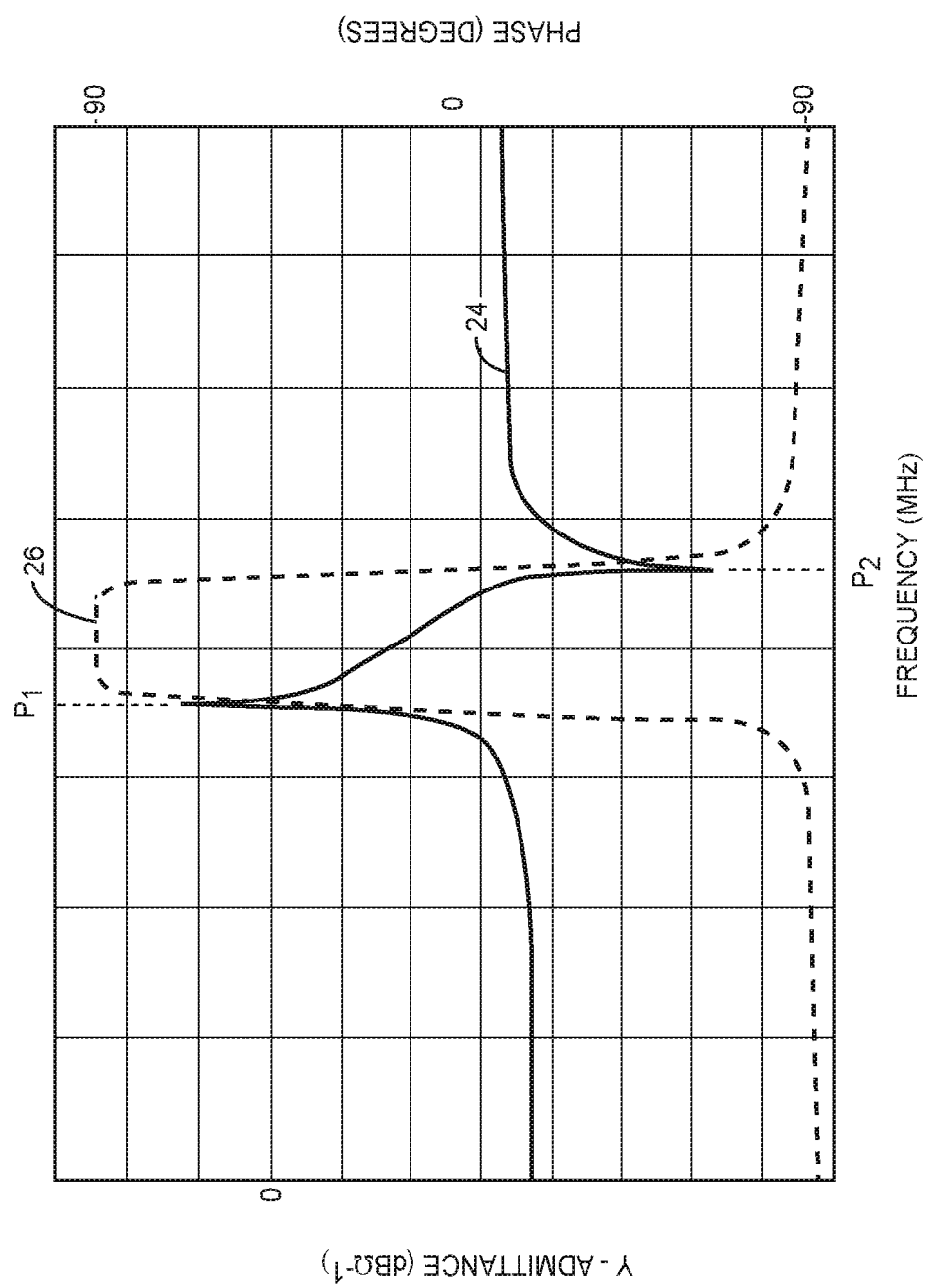
FIG. 2 is a graph illustrating the admittance and its phase of a guided SAW device according to one embodiment of the present disclosure.

FIG. 2 is a graph illustrating an ideal relationship of the admittance (shown by its amplitude and phase) between the first comb electrode 20A and the second comb electrode 20B to the frequency of the alternating electrical input signal for the guided SAW device 10. A solid line 24 illustrates the amplitude of the admittance between the first comb electrode 20A and the second comb electrode 20B with respect to the frequency of the alternating electrical input signal. Notably, the solid line 24 includes a peak at a first point P1 at which the admittance between the first comb electrode 20A and the second comb electrode 20B climbs rapidly to a maximum value. This peak occurs at the series resonant frequency ($f_S$) of the guided SAW device 10. The impedance between the first comb electrode 20A and the second comb electrode 20B is minimal at the series resonant frequency ($f_S$), such that the first comb electrode 20A and the second comb electrode 20B appear as a short-circuit. The solid line 24 also includes a valley at a second point P2 at which the admittance between the first comb electrode 20A and the second comb electrode 20B plummets rapidly to a minimum value. This valley occurs at the parallel resonant frequency ($f_P$) of the guided SAW device 10. The impedance between the first comb electrode 20A and the second comb electrode 20B is at a maximum at the parallel resonant frequency ($f_P$), such that an open circuit appears to be present between the first comb electrode 20A and the second comb electrode 20B.

A dashed line 26 illustrates the phase of the impedance between the first comb electrode 20A and the second comb electrode 20B with respect to the frequency of the alternating electrical input signal. Notably, the dashed line shows that a 180° phase shift occurs between the series resonant frequency ($f_S$) and the parallel resonant frequency ($f_P$). This phase shift is due to the change in the impedance from primarily capacitive to primarily inductive between the series resonant frequency ($f_S$) and the parallel resonant frequency ($f_P$).

Figure 3A:
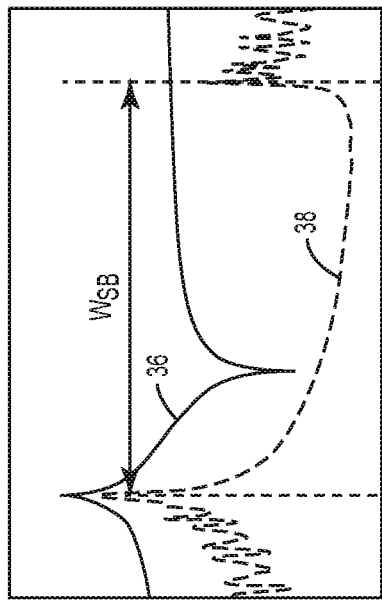
FIGS. 3A-3D are graphs illustrating the admittance, conductance, and quality factor of a guided saw device according to one embodiment of the present disclosure.
Figure 3C:
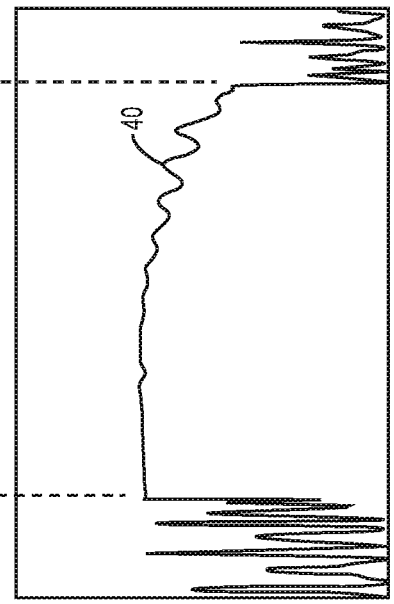
Figure 3B:
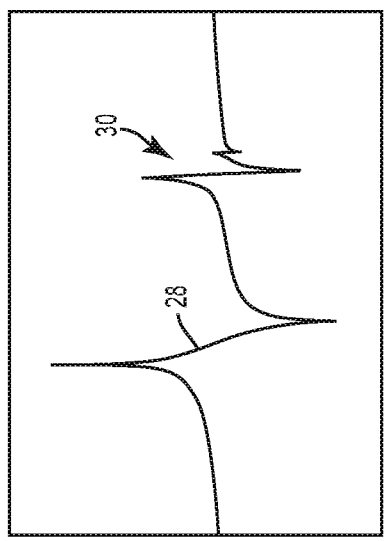
Figure 3D:
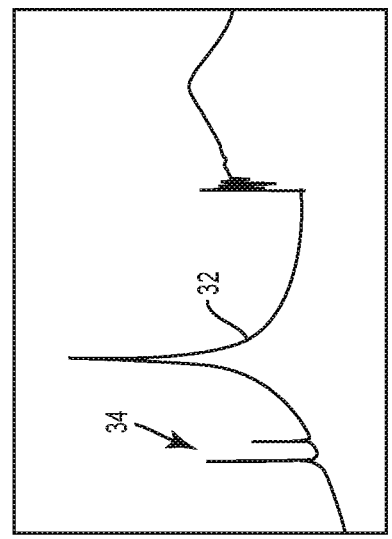

The graph shown in FIG. 2 is highly idealized. In reality, the response of the guided SAW device 10 includes spurious areas that degrade the performance thereof as discussed above. FIGS. 3A through 3D show non-idealized responses of the guided SAW device 10. Specifically, FIG. 3A is a graph illustrating the admittance of the guided SAW device 10, which is indicated by a solid line 28. As shown in FIG. 3A, the guided SAW device 10 includes higher order spurious modes 30 above the parallel resonant frequency ($f_P$). FIG. 3B is a graph illustrating the conductance of the guided SAW device 10, which is indicated by a solid line 32. As shown in FIG. 3B, the guided SAW device 10 includes lower frequency spurious modes 34 below the series resonant frequency ($f_S$). FIG. 3C is a graph illustrating a stopband of the guided SAW device 10. A solid line 36 illustrates the absolute value of the admittance and a dashed line 38 illustrates the real value of the admittance, which indicates the stopband of the guided SAW device 10. A stopband width $W_{SB}$ is defined as the distance between rising edges of the real value of the admittance illustrated by the dashed line 38. FIG. 3D is a graph illustrating the quality factor of the guided SAW device 10, which is indicated by a solid line 40. As discussed above, it is desirable to suppress the higher order spurious modes and the lower frequency spurious modes. Further, it is desirable to maximize the stopband width $W_{SB}$ and the quality factor.

As discovered by the inventors, one mechanism by which spurious modes are generated is the guidance of spurious waves within the piezoelectric layer 14. Such wave guidance occurs when spurious waves are reflected by the substrate 12 as illustrated in FIG. 4A, which is a cross-sectional view of the guided SAW device 10 with arrows indicating the guidance of spurious waves within the piezoelectric layer 14 due to reflection thereof by the substrate 12. FIG. 4B is a graph illustrating the effect of this wave guide effect on the admittance of the guided SAW device 10, which is illustrated by a solid line 42. The conductance of the guided SAW device 10 is illustrated with a dashed line 44. As illustrated, there are significant higher order spurious modes 46 above the parallel resonant frequency ($f_P$). Since the higher order spurious modes are due to resonance inside the piezoelectric layer, their frequency and number depends mostly on the thickness of the piezoelectric layer 14. In general, when the piezoelectric thickness increases, the frequency separation between the modes is reduced and the number of spurious modes increases. Generally, higher order spurious modes can be suppressed when they are above a cut-off frequency of the guided SAW device 10. A cut-off frequency 48 of the guided SAW device 10 is illustrated in FIG. 4B by a sharp rise in the conductance thereof. The cut-off frequency 48 of the guided SAW device 10 depends on a velocity of wave propagation in the substrate 12, which is mostly dependent on the material properties of the substrate 12. When the frequency of the spurious waves is above the cut-off frequency 48 of the guided SAW device 10, the spurious waves radiate into the substrate 12 and thus are suppressed, as illustrated in FIG. 4C. FIG. 4D is a graph illustrating the effect of this wave radiation effect on the admittance of the guided SAW device 10, which is illustrated by a solid line 50. The conductance of the guided SAW device 10 is illustrated with a dashed line 52. As illustrated, there is a significant reduction in higher order spurious modes.

As discussed above, the cutoff frequency depends mostly on the velocity in the substrate while the frequency of the spurious modes depends mostly on the thickness of the piezoelectric layer 14. The spurious modes are suppressed when the cutoff frequency is between the resonance frequency and the frequency of the first higher order spurious mode. For a given substrate velocity, there exists a maximum piezoelectric layer thickness such that the spurious modes are all above the cutoff frequency or conversely, for a given piezoelectric layer thickness there is a maximum substrate velocity such that the higher order modes are suppressed.

Figure 5:
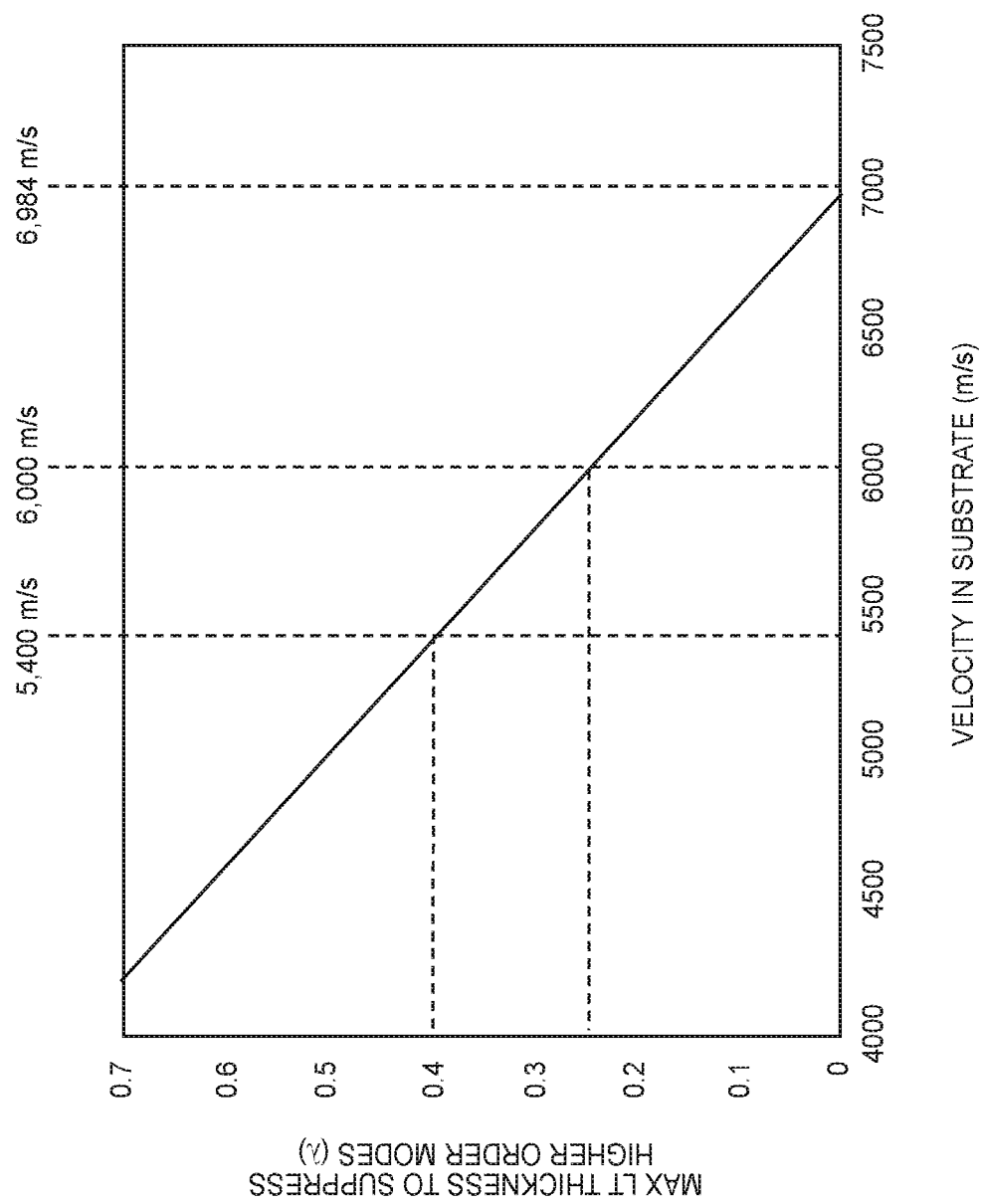
FIG. 5 is a graph illustrating a relationship between the velocity of wave propagation in a substrate and a maximum thickness of a piezoelectric layer on the substrate to suppress higher order modes according to one embodiment of the present disclosure.

As shown in FIG. 5, a maximum thickness of the piezoelectric layer 14 in order to suppress higher order modes is proportional to a velocity of wave propagation in the substrate. In FIG. 5, if the thickness of the piezoelectric layer 14 is below the solid line, higher order modes can be suppressed. As discussed above it is desirable to reduce the velocity of wave propagation in the substrate 12 in order to allow radiation of spurious waves and thus reduction of higher order spurious modes within the wide range of thicknesses of the piezoelectric layer 14. Generally, it is desirable to limit the velocity of wave propagation in the substrate 12 to below 6000 m/s because the thickness of the piezoelectric layer 14 can be more than 0.25λ when the velocity of wave propagation in the substrate 12 is below 6000 m/s. If the thickness of the piezoelectric layer 14 is more than 0.25λ, the piezoelectric layer 14 can be easily fabricated, since the thickness of the piezoelectric layer 14 can be controlled at this level. As discussed above is the wavelength for the surface wave of the center frequency and is a multiple of the transducer period More preferably, it is desirable to limit the velocity of wave propagation in the substrate 12 to below 5400 m/s. In this case, the thickness of the piezoelectric layer 14 can be more than 0.40λ, which makes fabrication of the piezoelectric layer 14 even easier.

Figure 6A:
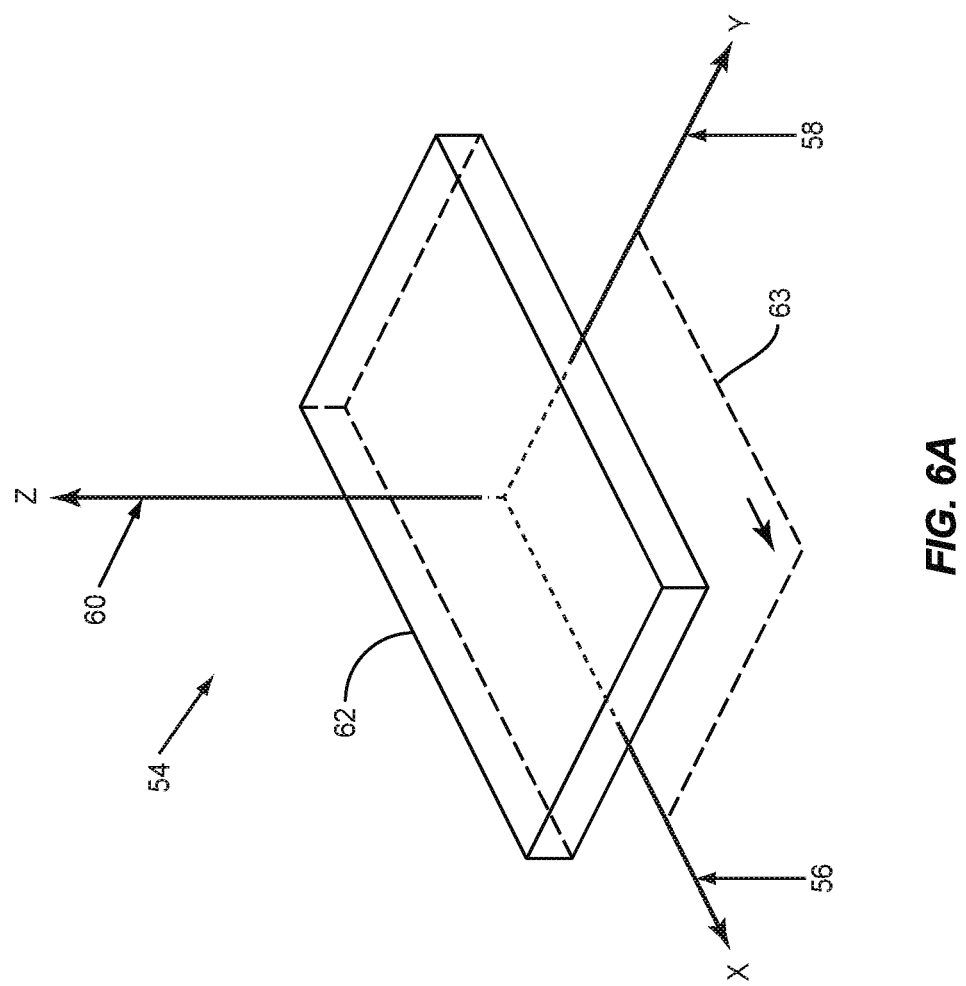
FIGS. 6A-6D illustrate the concept of Euler angles and how they describe the crystalline orientation of a material according to one embodiment of the present disclosure.

As further discussed above, the velocity of wave propagation in the substrate 12 is also dependent on the material properties of the substrate 12. In particular, the velocity of wave propagation in the substrate 12 is dependent on the crystalline orientation of the substrate 12. One way to describe the crystalline orientation of a material is using Euler angles. FIGS. 6A-6D illustrate the basic principles of how Euler angles describe a crystalline orientation of a material. FIG. 6A shows a coordinate system 54 including an x-axis 56, a y-axis 58, and a z-axis 60, all three of which are perpendicular to one another. A crystalline structure 62 is also illustrated. The crystalline structure 62 is initially aligned with the coordinate system 54 such that the x-axis 56 is the direction of wave propagation therein and the z-axis 60 is the outward directed normal to the surface thereof. An initial cut plane 63 is perpendicular to the z-axis 60, with a wave propagation direction indicated by an arrow provided therein.

Figure 6B:
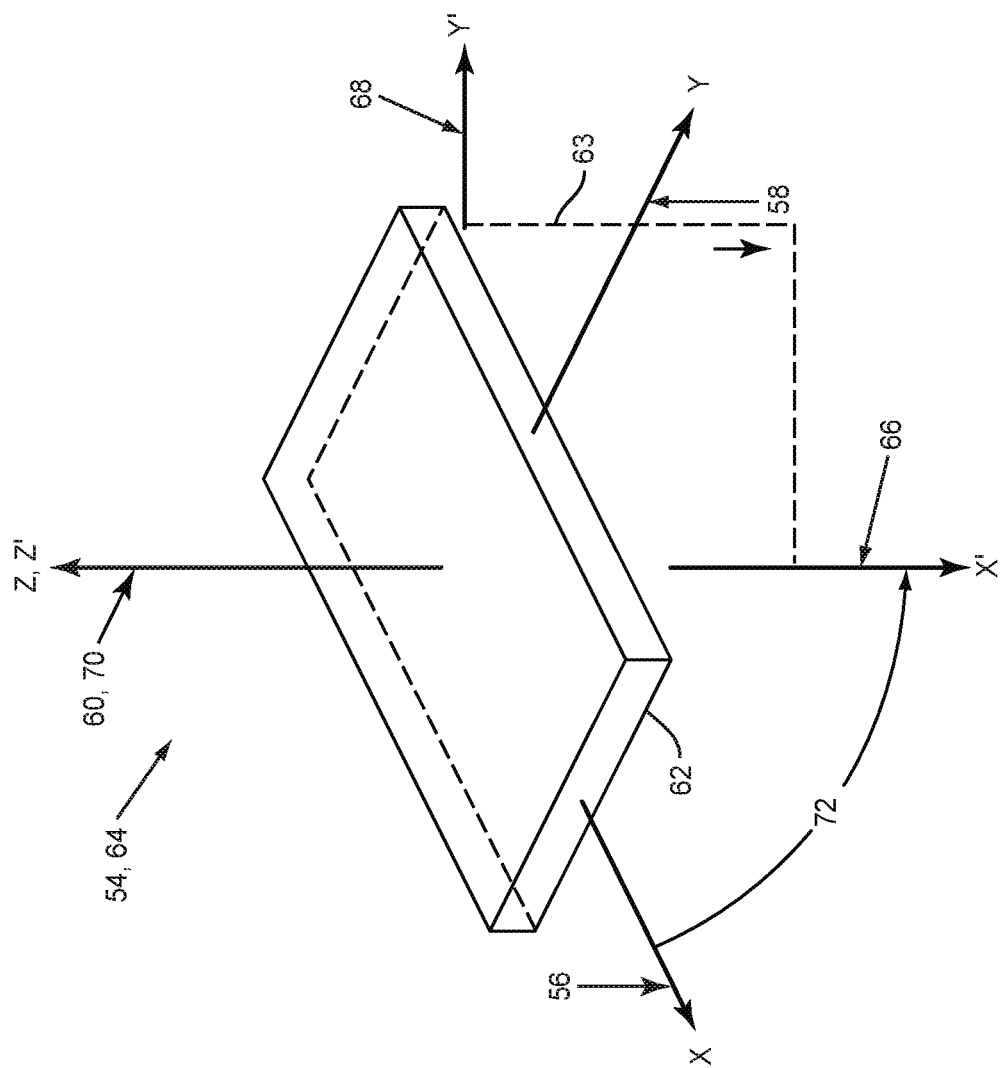

FIG. 6B shows the coordinate system 54 and a first translated coordinate system 64, which is obtained by keeping the z-axis 60 stationary and rotating the x-axis 56 toward the y-axis 58 to form a first translated x-axis 66, a first translated y-axis 68, and a first translated z-axis 70 (designated with a single prime indicator), which are all perpendicular to one another. A first Euler angle 72 is the angle formed between the x-axis 56 and the first translated x-axis 66. The first translated z-axis 70 is coincident with the z-axis 60. The crystalline structure 62 remains static while the cut plane 63 is translated into the first translated coordinate system 64.

Figure 6C:
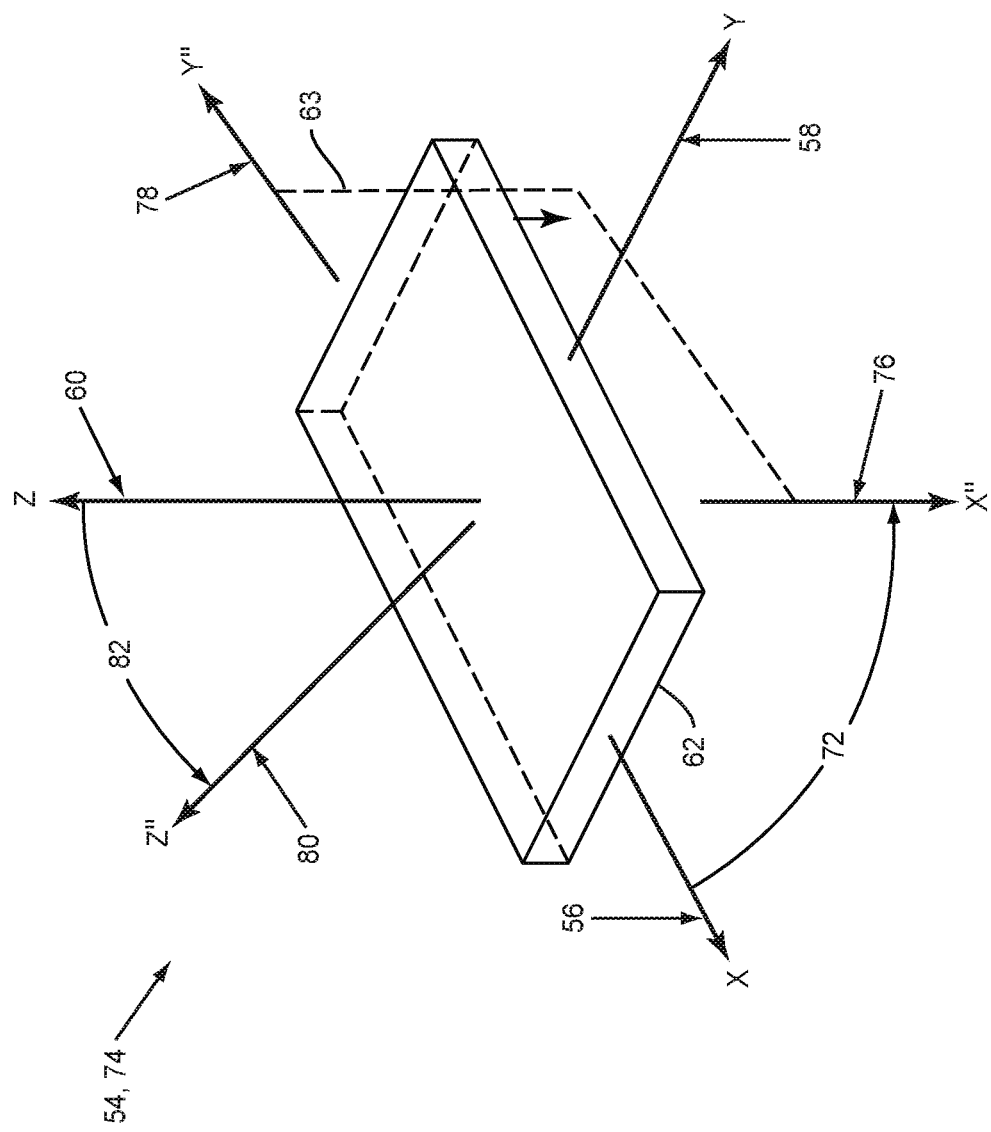

FIG. 6C shows the coordinate system 54 and a second translated coordinate system 74, which is obtained by keeping the first translated x-axis 66 stationary and rotating the first translated z-axis 70 away from the first translated y-axis 68 to form a second translated x-axis 76, a second translated y-axis 78, and a second translated z-axis 80 (designated with a double prime indicator), which are all perpendicular to one another. A second Euler angle 82, which is achieved after obtaining the first Euler angle 72, is the angle formed between the z-axis 60 and the second translated z-axis 80. Since the first translated z-axis 70 is coincident with the z-axis 60, the second Euler angle 82 is equal to the angle formed between the first translated z-axis 70 and the second translated z-axis 80. The first translated x-axis 66 is coincident with the second translated x-axis 76. Again, the crystalline structure 62 remains static while the cut plane 63 is translated into the second translated coordinate system 74.

Figure 6D:
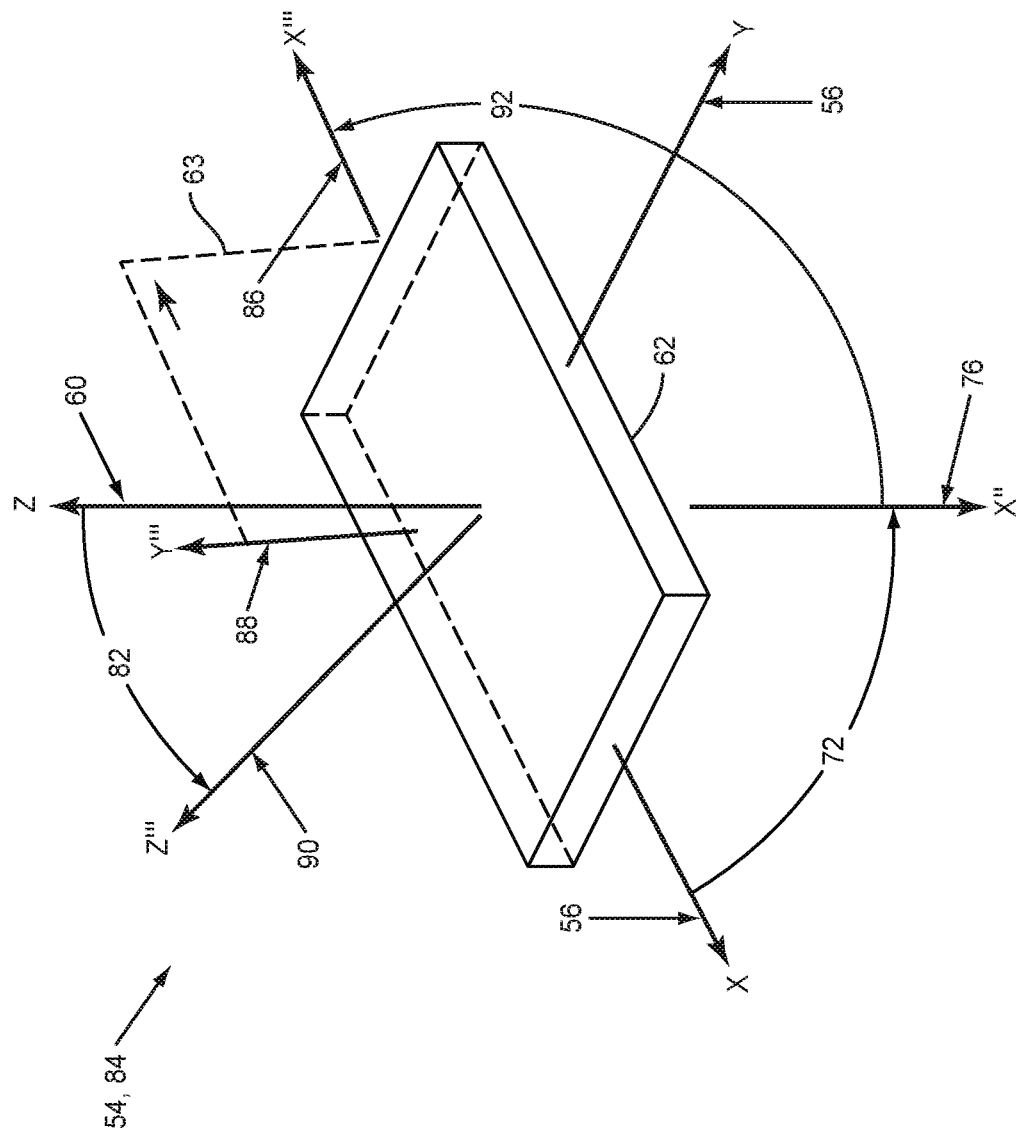

FIG. 6D shows the coordinate system 54 and a third translated coordinate system 84, which is obtained by keeping the second translated z-axis 80 stationary and rotating the second translated x-axis 76 toward the second translated y-axis 78 to form a third translated x-axis 86, a third translated y-axis 88, and a third translated z-axis 90 (designated with a triple prime indicator), all of which are perpendicular to one another. A third Euler angle 92, which is achieved after obtaining the second Euler angle 82, is the angle formed between the second translated x-axis 76 and the third translated x-axis 86. Since the first translated x-axis 66 is coincident with the second translated x-axis 76, the third Euler angle 92 is equal to the angle formed between the first translated x-axis 66 and the third translated x-axis 86. The second translated z-axis 80 is coincident with the third translated z-axis 90. Again, the crystalline structure 62 remains static while the cut plane 63 is translated into the third translated coordinate system 84. The first Euler angle 72 is referred to as Phi ($\phi$), the second Euler angle 82 is referred to as Theta ($\theta$), and the third Euler angle 92 is referred to as Psi ($\psi$).

As will be appreciated by those skilled in the art, silicon crystal is a cubic system of m3m, so its crystal structure is symmetric about the x, y, and z plane and the x, y, and z axes are interchangeable with each other. Accordingly, the Euler angle to indicate a specific orientation of silicon is not unique. There are several sets of Euler angles to indicate the exact same orientation of Si. For example, Si(100) can be expressed by Euler angles of (90°, 90°, $\psi$), (0°, 90°, $\psi$), (90°, 0°, $\psi$), (90°, 90°, $\psi$+90°), and so on, where (100) are Miller indices defining a plane along which the silicon is cut, as will be appreciated by those skilled in the art. In the description herein, certain definitions of Euler angles to indicate Si(100), Si(110), and Si(111) may be used for purposes of explanation and/or example, but those skilled in the art will appreciate that all of the different definitions of Euler angles to indicate Si(100), Si(110), and Si(111) are contemplated herein.

To calculate the optimal crystalline orientation of the substrate 12, slowness curves for three base crystalline orientations for silicon were determined, as illustrated in FIGS. 7A through 7C. Each one of FIGS. 7A through 7C shows a slowness curve and a graph illustrating the velocity of wave propagation in the substrate 12 with respect to the propagation angle of the waves therein. FIG. 7A shows the results for silicon where the first and second Euler angles ($\phi,\theta$) are fixed according to the plane defined by Miller indices (100) e.g., (90°, 90°,$\psi$), FIG. 7B shows the results for silicon where the first and second Euler angles ($\phi,\theta$) are fixed according to the plane defined by Miller indices (110) e.g., (135°, 90°,$\psi$+35.264°), and FIG. 7C shows the results for silicon where the first and second Euler angles ($\phi,\theta$) are fixed according to the plane defined by Miller indices (111) e.g., (135°, 54.7356°, $\psi$). A slowness curve is shown for each one of a longitudinal mode wave, a fast shear mode wave, and a slow shear mode wave, where the waves are propagating in a direction defined by the third Euler angle ($\psi$). Each one of the graphs similarly illustrates a velocity of each one of the longitudinal mode wave, the fast shear mode wave, and the slow shear mode wave with respect to the third Euler angle ($\psi$). The cut-off frequency of the guided SAW device 10 is determined by the slowest wave type of the longitudinal mode wave, the fast shear mode wave, and the slow shear mode wave.

To restrict the velocity of wave propagation in the substrate 12 below 6,000 m/s, any of the reference cuts and any propagation angle $\psi$ can be used. To restrict the velocity of wave propagation in the substrate 12 below 5,400 m/s, only certain ranges of the third Euler angle (ψ) may be used in the case of the reference crystalline orientations show in FIGS. 7A and 7B. In particular, when the first and second Euler angles (φ,θ) are fixed according to the miller plane (100) as in FIG. 7A, the third Euler angle (ψ) should be between 18° and 72° or between 108° and 162° to keep the velocity of wave propagation in the substrate 12 below 5400 m/s. When the first and second Euler angles (φ,θ) are fixed according to the miller plane (110) as in FIG. 7B, the third Euler angle (ψ) should be between 0° and 34° or between 75° and 180° to keep the velocity of wave propagation in the substrate 12 below 5400 m/s. When the first and second Euler angles (φ,θ) are fixed according to the miller plane (111) as in FIG. 7C, the third Euler angle (ψ) can be anywhere between 0° and 180° to keep the velocity of wave propagation in the substrate 12 below 5400 m/s.

Even when lowering the cut-off frequency by carefully selecting the crystalline orientation of the substrate 12 as discussed above, there is a subset of crystalline orientations for the substrate 12 that provide superior suppression of higher order spurious modes, as illustrated in FIGS. 8A through 8C. Each one of these figures shows the admittance of the guided SAW device 10 for different crystalline orientations of the substrate 12 with a fixed thickness (e.g., 0.4λ) of the piezoelectric layer 14. Specifically, FIG. 8A shows the admittance for the guided SAW device 10 where the substrate 12 is defined by crystalline orientation (φ,θ,ψ)=(90°,90°,45°), FIG. 8B shows the admittance for the guided SAW device 10 where the substrate 12 is defined by the crystalline orientation (φ,θ,ψ)=(135°, 90°,35.264°), and FIG. 8C shows the admittance for the guided SAW device 10 where the substrate 12 is defined by the crystalline orientation (φ,θ,ψ)=(135°, 54.7356°,0°). While the crystalline orientation of the substrate 12 in each one of FIGS. 8A through 8C ensures that the higher order spurious modes are above a cut-off frequency illustrated by a vertical dashed line, the crystalline orientation for the guided SAW device 10 in FIG. 8B provides the largest reduction in higher order spurious modes, the crystalline orientation for the guided SAW device 10 in FIG. 8C provides the next largest reduction in higher order spurious modes, and the crystalline orientation for the guided SAW device 10 in FIG. 8A provides the lowest reduction in higher order spurious modes.

Figures 9A, 9B, 9C:
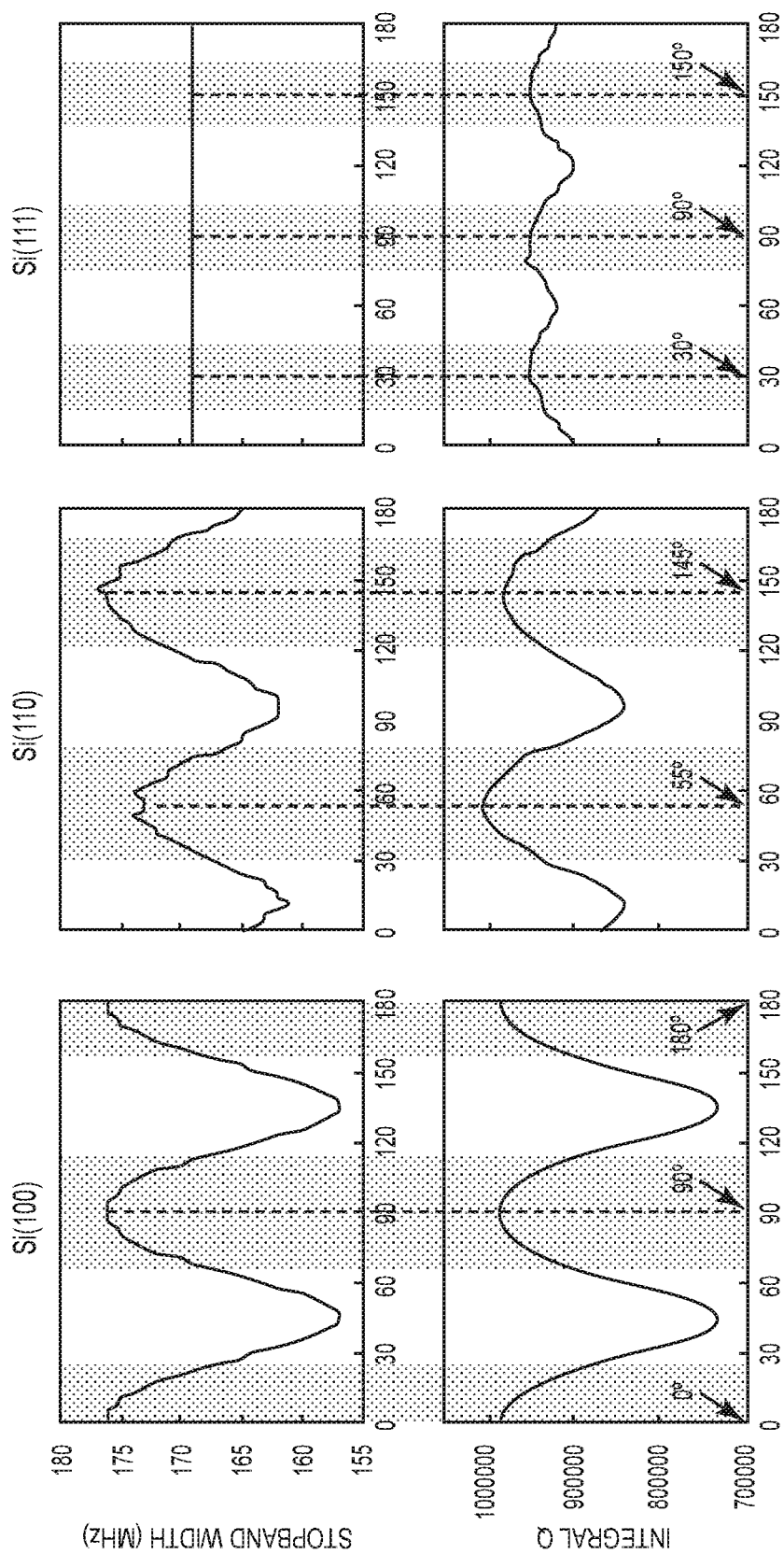
FIGS. 9A-9C illustrate a relationship between stopband width and the crystalline orientation of a substrate of a guided SAW device according to one embodiment of the present disclosure.

As discussed above, in addition to reducing higher order spurious modes, it is also desirable to maximize stopband width and quality factor. To demonstrate this, FIGS. 9A through 9C each show two graphs, one illustrating a relationship between stopband width and the crystalline orientation of the substrate 12 and the other illustrating a relationship between integral quality factor, which is defined by the total area under a quality factor curve within the stopband, and the crystalline orientation of the substrate 12. Specifically, FIG. 9A illustrates these relationships for the guided SAW device 10 including the substrate 12 where the first and second Euler angles (φ,θ) are fixed according to the miller plane (100) such that φ=90° and θ=90°, FIG. 9B illustrates these relationships for the guided SAW device 10 including the substrate 12 where the first and second Euler angles (φ,θ) are fixed according to the miller plane (110) such that φ=135° and θ=90° and the third Euler angle ψ is offset by +35.264°, and FIG. 9C illustrates these relationships for the guided SAW device 10 including the substrate 12 where the first and second Euler angles (φ,θ) are fixed according to the miller plane (111) such that φ=135° and θ=54.7356°.

The graphs of the stopband width and the integral quality factor are aligned in order to see the overlap between maximized portions thereof. As illustrated, the crystalline orientation of the substrate 12 for the guided SAW device 10 in FIG. 9A provides the highest stopband width and integral quality factor when the third Euler angle (ψ) is 0°±25° or 90°±25°. Specifically, the stopband width of the guided SAW device 10 is at least 165 MHz and the integral quality factor is at least 880,000 at these crystalline orientations. The crystalline orientation of the substrate 12 for the guided SAW device 10 in FIG. 9B provides the highest stopband width and integral quality factor when the third Euler angle (ψ) is 55°±25° or 145°±25°. Specifically, the stopband width of the guided SAW device 10 is at least 165 MHz and the integral quality factor is at least 900,000 at these crystalline orientations. The crystalline orientation of the substrate 12 for the guided SAW device 10 in FIG. 9C provides the highest stopband width and integral quality factor when the third Euler angle (ψ) is 30°±15° or 90°±15° or 150°±15°. Specifically, the stopband width of the guided SAW device 10 is at least 165 MHz and the integral quality factor is at least 920,000 at these crystalline orientations.

Further as discussed above, in addition to reducing higher order spurious modes, maximizing stopband width, and maximizing quality factor, it is also desirable to reduce lower frequency spurious modes. To demonstrate this, FIGS. 10A through 10C each show two graphs, one illustrating a relationship between peak conductance for a first low frequency spurious mode (see the larger peak of the lower frequency spurious modes 34 shown in FIG. 3B, illustrated as a solid line) and a second low frequency spurious mode (see the smaller peak of the lower frequency spurious modes 34 shown in FIG. 3B, illustrated as a dashed line) and the third Euler angle (ψ) of the substrate 12 and the other illustrating a relationship between peak conductance of a combination of the first low frequency spurious mode and the second low frequency spurious mode and the third Euler angle (ψ) of the substrate 12. Specifically, FIG. 10A illustrates these relationships for the guided SAW device 10 including the substrate 12 where the first and second Euler angles (φ,θ) are fixed according to the miller plane (100) such that φ=90° and θ=90°, FIG. 10B illustrates these relationships for the guided SAW device 10 including the substrate 12 where the first and second Euler angles (φ,θ) are fixed according to the miller plane (110) such that φ=135° and θ=90° and the third Euler angle ψ is offset by +35.264°, and FIG. 10C illustrates these relationships for the guided SAW device 10 including the substrate 12 where the first and second Euler angles (φ,θ) are fixed according to the miller plane (111) such that φ=135° and θ=54.7356°.

The graphs are aligned in order to see the overlap between minimized portions of the low frequency spurious modes. As illustrated, the crystalline orientation of the substrate 12 for the guided SAW device 10 shown in FIG. 10A provides the highest suppression of lower frequency spurious modes when the third Euler angle (ψ) is 0°±7.5°, 45°±7.5°, 90°±7.5°, or 135°±7.5°. Specifically, the lower frequency spurious modes have a peak conductance less than 0.01 Siemens at these crystalline orientations and for a simulated resonator used to obtain the values shown in the figure. The crystalline orientation of the substrate 12 for the guided SAW device 10 shown in FIG. 10B provides the highest suppression of lower frequency spurious modes when the third Euler angle (ψ) is 15°±7.5°, 55°±7.5°, 95°±7.5°, or 145°±7.5°. Specifically, the lower frequency spurious modes have a peak conductance less than 0.01 Siemens at these crystalline orientations for the simulated resonator. The crystalline orientation of the substrate 12 for the guided SAW device 10 shown in FIG. 10C provides the highest suppression of lower frequency spurious modes when the third Euler angle (ψ) is 33°±10°, 87°±10°, or 153°±10°. Specifically, the lower frequency spurious modes have a peak conductance less than 0.1 Siemens at these crystalline orientations for the simulated resonator.

As shown above, certain crystalline orientations for the substrate 12 reduce higher order spurious modes, maximize stopband width and quality factor, and reduce lower frequency spurious modes. Since it is desirable to simultaneously accomplish all of these tasks, it is advantageous to determine the overlapping crystalline orientations that accomplish each of these tasks. To demonstrate this, FIGS. 11A through 11C each show charts illustrating optimal crystalline orientations for higher order spurious mode suppression, wider stopband width and higher integral quality factor, and lower frequency spurious mode suppression. Specifically, FIG. 11A illustrates the optimal ranges for the third Euler angle (ψ) defining the crystalline orientation of the substrate 12 where the first and second Euler angles (φ,θ) are fixed according to the miller plane (100) such that φ=90° and θ=90°, FIG. 11B illustrates the optimal ranges for the third Euler angle (ψ) defining the crystalline orientation of the substrate 12 where the first and second Euler angles (φ,θ) are fixed according to the miller plane (110) such that φ=135° and θ=90° and the third Euler angle ψ is offset by +35.264°, and FIG. 11C illustrates the optimal ranges for the third Euler angle (ψ) defining the crystalline orientation of the substrate 12 where the first and second Euler angles (φ,θ) are fixed according to the miller plane (111) such that φ=135° and θ=54.7356°.

Specifically, a first shaded region 94 indicates the range of the third Euler angle (ψ) wherein a velocity of wave propagation in the substrate 12 is less than 5,400 m/s as discussed above with respect to FIGS. 7A through 7C. A second shaded region 96 indicates the range of the third Euler angle (ψ) wherein a stopband provided by the guided SAW device 10 has a bandwidth greater than 165 MHz and an integral quality factor within this stopband greater than 800,000 as discussed above with respect to FIGS. 9A through 9C. A third shaded region 98 indicates the range of the third Euler angle (ψ) wherein a peak conductance of lower frequency spurious modes below the series resonance frequency ($f_S$) is less than 0.01 Siemens as discussed above with respect to FIGS. 10A through 10C. The overlapping regions of each illustrate the optimal regions for two or more of these parameters. The ideal range for the third Euler angle (ψ) for each base crystalline orientation of silicon discussed above is illustrated where all three of the first shaded region 94, the second shaded region 96, and the third shaded region 98 overlap.

Figures 11A, 11B, 11C:
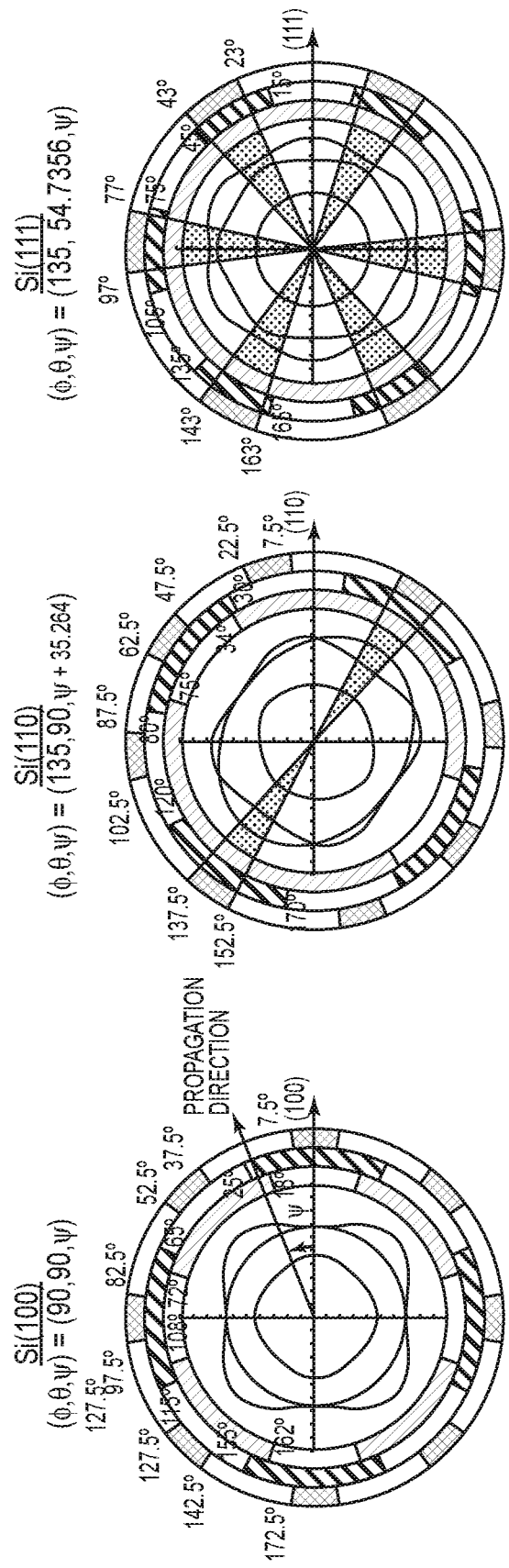
FIGS. 11A-11C illustrate a relationship between stopband width, quality factor, lower frequency spurious mode suppression, higher order spurious modes suppression, and the crystalline orientation of a substrate of a guided SAW device according to one embodiment of the present disclosure.

As shown in FIG. 11A, there is no overlap for crystalline orientations for all of the above parameters. Accordingly, there is no range for the third Euler angle (ψ) here that reduces both higher order and lower frequency spurious modes while maximizing stopband bandwidth and integral quality factor. However, there is overlap between two or more of the shaded regions and thus certain ranges for the third Euler angle (ψ) may provide multiple benefits. In FIG. 11B, there is overlap where the third Euler angle (ψ) is 145°±7.5°. This is illustrated by a fourth shaded region 100. Accordingly, these crystalline orientations for the substrate 12 will provide suppression of higher order spurious modes, wider stopband and higher quality factor, and suppression of lower frequency spurious modes. In FIG. 11C, there is overlap where the third Euler angle (ψ) is 33°±10°, 87°±10°, or 153°±10°. This is illustrated by the fourth shaded region 100. Accordingly, these crystalline orientations for the substrate 12 will provide suppression of higher order spurious modes, wider stopband and higher quality factor, and suppression of lower frequency spurious modes.

Figure 12:
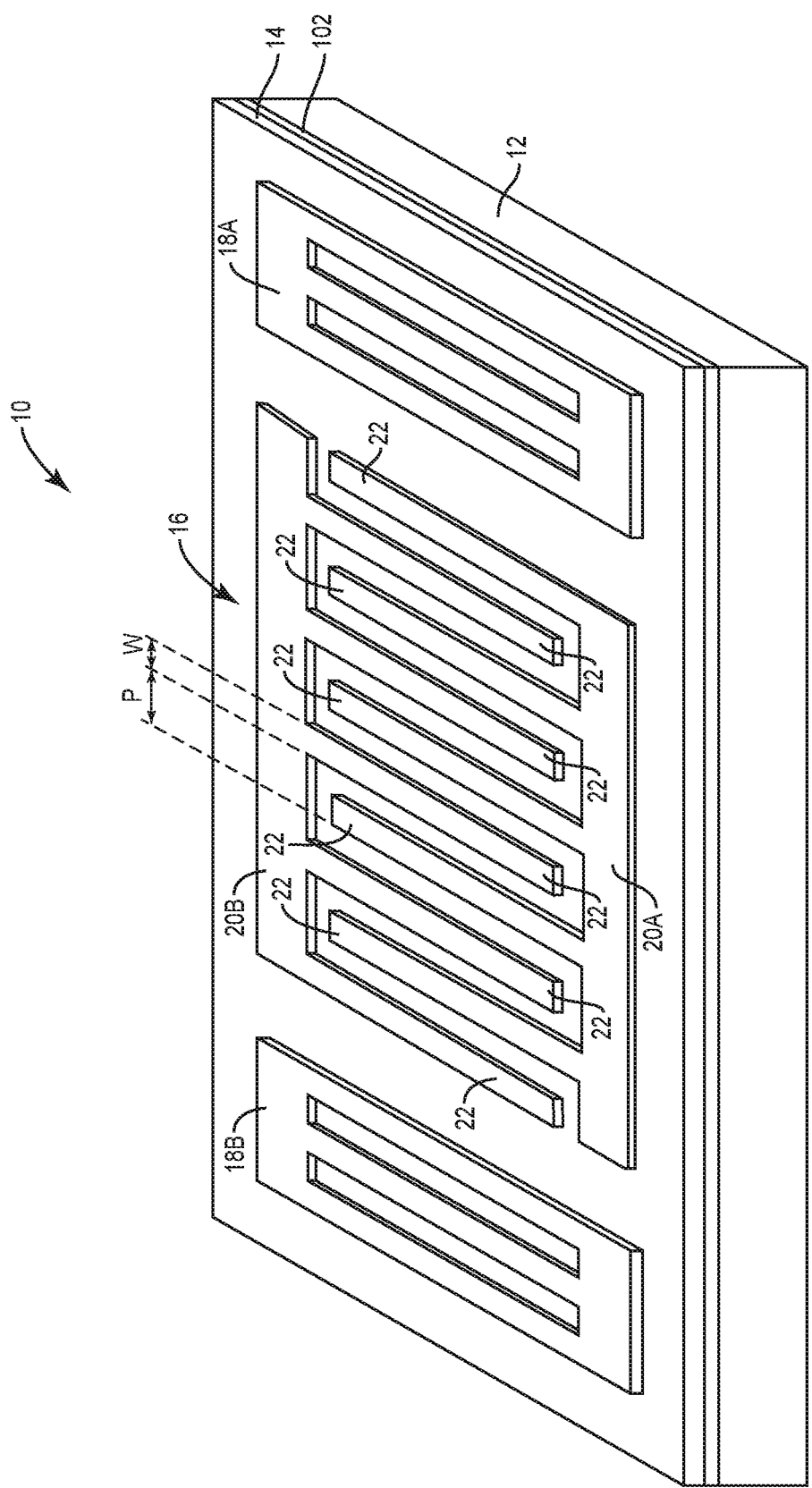
FIG. 12 illustrates a guided SAW device according to one embodiment of the present disclosure.

As discussed above, the guided SAW device 10 may include layers between the substrate 12 and the piezoelectric layer 14 in certain embodiments. For example, the guided SAW device 10 may include an oxide layer 102 between the substrate 12 and the piezoelectric layer 14 as shown in FIG. 12. The oxide layer 102 may be silicon dioxide or any other suitable material, and may have a thickness in the range of 0.08λ. In some cases, several layers can be inserted between the substrate 12 and the piezoelectric layer 14. Impurities like fluorine can be implanted in the silicon dioxide to reduce the temperature sensitivity of the device.

In some embodiments, the substrate 12 may be implanted or damaged with certain elements to increase the resistivity thereof and decrease carrier lifetime. For example, the substrate 12 may be implanted with silicon, arsenic, krypton, beryllium, carbon, nitrogen, oxygen, neon, or any other suitable element. Further, the substrate 12 may be implanted with deep "traps" so that electrical losses are reduced. These deep "traps" may be in the form of metal ions such as gold, vanadium, cobalt, zinc, copper, or any other suitable element. Further, these "traps" may be provided in a separate layer. For example, a poly-silicon layer may be provided between the substrate 12 and the oxide layer 102, or a layer of amorphous silicon may be provided between the substrate 12 and the oxide layer 102. Details of such embodiments can be found in co-assigned and co-pending U.S. Patent Publication No. 20170033764A1, the contents of which are hereby incorporated by reference in their entirety.

While the principles of the present disclosure are discussed with respect to a device including a single transducer, those skilled in the art will readily appreciate that the concepts discussed herein apply equally to devices including multiple transducers such as coupled resonator filters and the like.

Those skilled in the art will recognize improvements and modifications to the preferred embodiments of the present disclosure. All such improvements and modifications are considered within the scope of the concepts disclosed herein and the claims that follow.

What is claimed is:

1. A guided surface acoustic wave (SAW) device comprising:
 a silicon substrate having a crystalline orientation defined by a first Euler angle (φ), a second Euler angle (θ), and a third Euler angle (ψ), wherein the first Euler angle (φ), the second Euler angle (θ), and the third Euler angle (ψ) are chosen such that a velocity of wave propagation within the substrate is less than 5,400 m/s;
 a piezoelectric layer on the silicon substrate; and
 a transducer on the piezoelectric layer.

2. The guided SAW device of claim 1 wherein:
 the first Euler angle (φ) and the second Euler angle (θ) are fixed according to Miller plane (100); and
 the third Euler angle (ψ) is between one of 18°-72° and 108°-162°.

3. The guided SAW device of claim 1 wherein:
 the first Euler angle (φ) and the second Euler angle (θ) are fixed according to Miller plane (110); and
 the third Euler angle (ψ) is between one of (0°-34°)+35.264° and (75°-180°)+35.264°.

4. The guided SAW device of claim 1 wherein:
the first Euler angle ($\phi$) and the second Euler angle ($\theta$) are fixed according to Miller plane (111); and
the third Euler angle ($\psi$) is between 0°-180°.

5. The guided SAW device of claim 1 wherein the piezoelectric layer comprises lithium tantalate.

6. The guided SAW device of claim 5 wherein the transducer is an interdigital transducer comprising:
a first comb electrode comprising a first bus bar and a first plurality of electrode fingers extending transversely from the first bus bar; and
a second comb electrode comprising a second bus bar and a second plurality of electrode fingers extending transversely from the second bus bar such that:
the first bus bar is parallel to the second bus bar;
the first plurality of electrode fingers extend from the first bus bar towards the second bus bar;
the second plurality of electrode fingers extend from the second bus bar towards the first bus bar; and
the first plurality of electrode fingers are interleaved with the second plurality of electrode fingers.

7. The guided SAW device of claim 1 wherein the transducer is an interdigital transducer comprising:
a first comb electrode comprising a first bus bar and a first plurality of electrode fingers extending transversely from the first bus bar; and
a second comb electrode comprising a second bus bar and a second plurality of electrode fingers extending transversely from the second bus bar such that:
the first bus bar is parallel to the second bus bar;
the first plurality of electrode fingers extend from the first bus bar towards the second bus bar;
the second plurality of electrode fingers extend from the second bus bar towards the first bus bar; and
the first plurality of electrode fingers are interleaved with the second plurality of electrode fingers.

8. The guided SAW device of claim 1 wherein:
the first Euler angle ($\phi$) and the second Euler angle ($\theta$) are fixed according to Miller plane (100); and
the third Euler angle ($\psi$) is between one of 18°-25°, 65°-72°, 108°-115°, and 155°-162°.

9. The guided SAW device of claim 1 wherein:
the first Euler angle ($\phi$) and the second Euler angle ($\theta$) are fixed according to Miller plane (110); and
the third Euler angle ($\psi$) is between one of (30°-34°)+35.264, (75°-80°)+35.264°, and (120°-170°)+35.264°.

10. The guided SAW device of claim 1 wherein:
the first Euler angle ($\phi$) and the second Euler angle ($\theta$) are fixed according to Miller plane (111); and
the third Euler angle ($\psi$) is between 15°-45°, 75°-105°, and 135°-165°.

11. The guided SAW device of claim 9 wherein:
the first Euler angle ($\phi$) and the second Euler angle ($\theta$) are fixed according to Miller plane (110); and
the third Euler angle ($\psi$) is between (137.5°-152.5°)+35.264°.

12. The guided SAW device of claim 10 wherein:
the first Euler angle ($\phi$) and the second Euler angle ($\theta$) are fixed according to Miller plane (111); and
the third Euler angle ($\psi$) is between 23°-43°, 77°-97°, and 143°-163°.

13. The guided SAW device of claim 1 wherein:
the first Euler angle ($\phi$) and the second Euler angle ($\theta$) are fixed according to Miller plane (100); and
the third Euler angle ($\psi$) is between one of 37.5°-52.5° and 127.5°-142.5°.

14. The guided SAW device of claim 1 wherein:
the first Euler angle ($\phi$) and the second Euler angle ($\theta$) are fixed according to Miller plane (110); and
the third Euler angle ($\psi$) is between (7.5°-22.5°)+35.264°, (87.5°-102.5°)+35.264°, and (137.5°-152.5°)+35.264°.

15. The guided SAW device of claim 1 wherein:
the first Euler angle ($\phi$) and the second Euler angle ($\theta$) are fixed according to Miller plane (111); and
the third Euler angle ($\psi$) is between 23°-43°, 77°-97°, and 143°-163°.

16. The guided SAW device of claim 1 wherein a surface of the substrate on which the piezoelectric layer is provided is modified to reduce carrier lifetimes in the substrate.

17. The guided SAW device of claim 16 wherein the surface of the substrate on which the piezoelectric layer is provided is subjected to ion implantation to reduce carrier lifetimes in the substrate.

18. The guided SAW device of claim 16 wherein a polysilicon layer is provided between the substrate and the piezoelectric layer to reduce carrier lifetimes in the substrate.

19. The guided SAW device of claim 16 wherein a layer of amorphous silicon is provided between the substrate and the piezoelectric layer to reduce carrier lifetimes in the substrate.

* * * * *